United States Patent [19]

Yoon et al.

[11] Patent Number: 6,079,023
[45] Date of Patent: Jun. 20, 2000

[54] MULTI-BANK MEMORY DEVICES HAVING COMMON STANDBY VOLTAGE GENERATOR FOR POWERING A PLURALITY OF MEMORY ARRAY BANKS IN RESPONSE TO MEMORY ARRAY BANK ENABLE SIGNALS

[75] Inventors: Sei-Seung Yoon; Yong-Cheol Bae, both of Seoul, Rep. of Korea

[73] Assignee: Samsung Electronics Co., Ltd., Rep. of Korea

[21] Appl. No.: 09/222,853

[22] Filed: Dec. 30, 1998

[30] Foreign Application Priority Data

Dec. 30, 1997 [KR] Rep. of Korea .................. 97-77786

[51] Int. Cl.[7] ....................................... G06F 1/30
[52] U.S. Cl. .................... 713/300; 713/340; 713/320; 713/324; 713/330; 711/106; 711/5
[58] Field of Search .................... 713/320, 323, 713/324, 340, 300; 711/5, 106; 365/226, 229, 230.03, 201

[56] References Cited

U.S. PATENT DOCUMENTS

| | | | |
|---|---|---|---|
| 4,933,907 | 6/1990 | Kumanoya et al. | 365/222 |
| 5,162,681 | 11/1992 | Lee | 307/530 |
| 5,212,797 | 5/1993 | Miyake et al. | 395/750 |
| 5,280,455 | 1/1994 | Kanaishi | 365/229 |
| 5,404,543 | 4/1995 | Fauncher et al. | 713/300 |
| 5,453,959 | 9/1995 | Sakuta et al. | 365/222 |
| 5,528,538 | 6/1996 | Sakuta et al. | 365/189.09 |
| 5,587,648 | 12/1996 | Jinbo et al. | 323/269 |
| 5,604,709 | 2/1997 | Price | 365/229 |
| 5,615,162 | 3/1997 | Houston | 365/226 |
| 5,663,918 | 9/1997 | Javanifard et al. | 365/226 |
| 5,663,919 | 9/1997 | Shirley et al. | 365/226 |
| 5,673,231 | 9/1997 | Furutani | 365/203 |
| 5,696,729 | 12/1997 | Kitamura | 365/227 |
| 5,737,566 | 4/1998 | Sparks et al. | 711/100 |
| 5,754,075 | 5/1998 | Oh et al. | 327/536 |
| 5,765,002 | 6/1998 | Garnet et al. | 713/300 |
| 5,798,976 | 8/1998 | Arimoto | 365/222 |
| 5,808,953 | 9/1998 | Kim et al. | 365/226 |
| 5,811,861 | 9/1998 | Nunokawa | 257/379 |
| 5,822,597 | 10/1998 | Kawano et al. | 395/750.05 |
| 5,901,103 | 5/1999 | Harris, II et al. | 365/226 |

*Primary Examiner*—Ayaz R. Sheikh
*Assistant Examiner*—Raymond N Phan
*Attorney, Agent, or Firm*—Myers Bigel Sibley & Sajovec

[57] ABSTRACT

A semiconductor memory device having a plurality of memory array banks, a plurality of active array voltage generators, a standby array voltage generator and a plurality of switching means is provided. The semiconductor memory device includes a plurality of memory array banks in which information is stored, a plurality of active array voltage generators connected to the memory array banks, for generating predetermined active voltages in response to memory array bank enable signals for activating the memory array banks, a standby array voltage generator for generating a predetermined standby voltage so that the memory array banks are maintained in a standby state for operation, and a plurality of switching means connected between the memory array banks and the standby array voltage generator, for disconnecting the output of the standby array voltage generator from memory array banks in response to memory array bank enable signals for activating the memory array banks. The power consumption of the semiconductor memory device is reduced.

15 Claims, 4 Drawing Sheets

MULTI-BANK MEMORY DEVICES HAVING COMMON STANDBY VOLTAGE GENERATOR FOR POWERING A PLURALITY OF MEMORY ARRAY BANKS IN RESPONSE TO MEMORY ARRAY BANK ENABLE SIGNALS

BACKGROUND OF THE INVENTION

1. Field of the Invention

The present invention relates to a semiconductor memory device, and more particularly, to a semiconductor memory device for supplying a standby power supply voltage to a multitude of banks from a small number of standby array power supply devices.

2. Description of the Related Art

In order to store data in a memory array bank or read out data from a memory array bank, a power supply device for supplying a predetermined voltage to the memory array bank is necessary. Typical power supply devices are an active array voltage generator and a standby array voltage generator.

FIG. 1 is a schematic block diagram of a conventional semiconductor memory device 101 having a standby array voltage generator. Referring to FIG. 1, the conventional semiconductor memory device 101 includes first through fourth memory array banks 111 through 114, first through fourth active array voltage generators 121 through 124, and first through fourth standby array voltage generators 131 through 134.

The first through fourth memory array banks 111 through 114 are respectively driven by the first through fourth active array voltage generators 121 through 124, and also the first through fourth standby array voltage generators 131 through 134. In other words, one active array voltage generator and one standby array voltage generator are connected to each memory array bank. To read out data stored in the first through fourth memory array banks 111 through 114, a large current is necessary. The large current is supplied by the first through fourth active array voltage generators 121 through 124. The first through fourth standby array voltage generators 131 through 134 generate small standby currents necessary for sensing external signals of the first through fourth memory array banks 111 through 114.

A smaller number of standby array voltage generators, e.g., one or two, are enough to supply the standby current to the first through fourth memory array banks 111 through 114. However, conventionally, the same number of standby array voltage generators as memory array banks, that is, four, are used. This unnecessarily increases power consumption and the area occupied by these elements.

SUMMARY OF THE INVENTION

To solve the above problems, it is an object of the present invention to provide a semiconductor memory device having a standby array voltage generator by which power consumption is reduced.

Accordingly, to achieve the above object, there is provided a semiconductor memory device including a plurality of memory array banks in which information is stored, a standby array voltage generator for generating a predetermined standby voltage so that the memory array banks are maintained in a standby state for operation, and a plurality of switching means connected between the memory array banks and the standby array voltage generator, for disconnecting the output of the standby array voltage generator from memory array banks, in response to memory array bank enable signals for activating the memory array banks.

According to another aspect of the present invention, there is provided a semiconductor memory device including a plurality of memory array banks in which information is stored, a plurality of active array voltage generators connected to the memory array banks, for generating predetermined active voltages in response to memory array bank enable signals for activating the memory array banks, a standby array voltage generator for generating a predetermined standby voltage so that the memory array banks are maintained in a standby state for operation, and a plurality of switching means connected between the memory array banks and the standby array voltage generator, for disconnecting the output of the standby array voltage generator from memory array banks in response to memory array bank enable signals for activating the memory array banks.

The active array voltage generators each include a differential amplifier which receives a predetermined reference voltage and a memory array bank enable signal and outputs a predetermined voltage.

The standby array voltage generator includes a differential amplifier which receives a predetermined reference voltage and outputs a voltage equal to the reference voltage.

Each of the switching means includes a PMOS transistor for disconnecting the output of the standby array voltage generator from a memory array bank when a corresponding memory array bank enable signal is activated.

According to the present invention, the power consumption of the semiconductor device is reduced.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENTS

Hereinbelow, the present invention will be described in detail with reference to the accompanying drawings.

Figure 2:
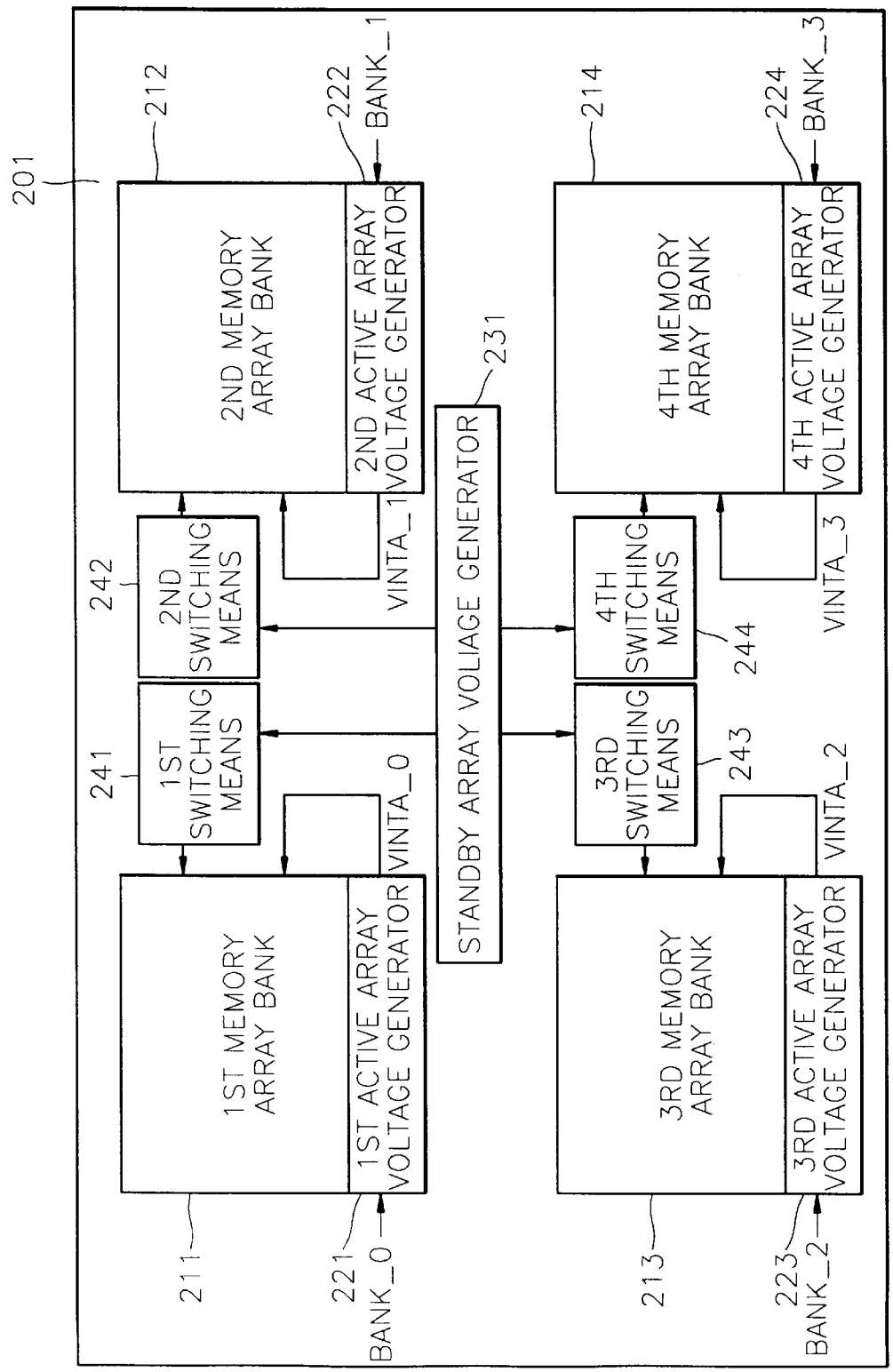
FIG. 2 is a schematic diagram illustrating a semiconductor memory device having standby array voltage generators, according to the first embodiment of the present invention.

FIG. 2 is a schematic diagram illustrating a semiconductor memory device 201 for explaining standby array voltage generators according to the first embodiment of the present invention. Referring to FIG. 2, the semiconductor memory device 201 includes first through fourth memory array banks 211 through 214, first through fourth active array voltage generators 221 through 224, first through fourth switching means 241 through 244 and a standby array voltage generator 231.

Externally input information is stored in the first through fourth memory array banks 211 through 214.

The first through fourth active array voltage generators 221 through 224 generate voltages necessary for activating the first through fourth memory array banks 211 through 214 in response to the first through fourth memory array bank enable signals BANK_0 through BANK_3. For example, if the first memory array bank enable signal BANK_0 is activated to a 'H' level, the first active array voltage generator 221 is activated to output a predetermined voltage VINTA_0 to the first memory array bank 211. Likewise, if the second through fourth memory array bank enable signals BANK_1 through BANK_3 are activated, the second through fourth active array voltage generators 222 through 224 are activated in the same manner as the first memory array bank enable signal BANK 0, to output predetermined voltages VINTA_1 through VINTA_3 to the second through fourth memory array banks 212 through 214, respectively.

The standby array voltage generator 231 generates a predetermined standby voltage for maintaining the first through fourth memory array banks 211 through 214 in a standby state for operation.

The first through fourth switching means 241 through 244 are connected between the standby array voltage generator 231 and the first through fourth memory array banks 211 through 214, respectively. When the first through fourth memory array bank enable signals BANK_0 through BANK_3 are inactivated to a 'L' level, the first through fourth switching means 241 through 244 are turned on and transmit the output of the standby array voltage generator 231 to the first through fourth memory array banks 211 through 214, respectively. When the first through fourth memory array bank enable signals BANK_0 through BANK_3 are activated to a 'H' level, the first through fourth switching means 241 through 244 are turned off and disconnect the output of the standby array voltage generator 231 from the first through fourth memory array banks 211 through 214, respectively.

For example, when the first memory array bank enable signal BANK_0 is inactivated to a 'L' level, the first switching means 241 is turned on and transmits the output of the standby array voltage generator 231 to the first memory array bank 211. When the first memory array bank enable signal BANK_0 is activated to a 'H' level, the first switching means 241 is turned off and prevents the output of the standby array voltage generator 231 from being transmitted to the first memory array bank 211.

Figure 1:
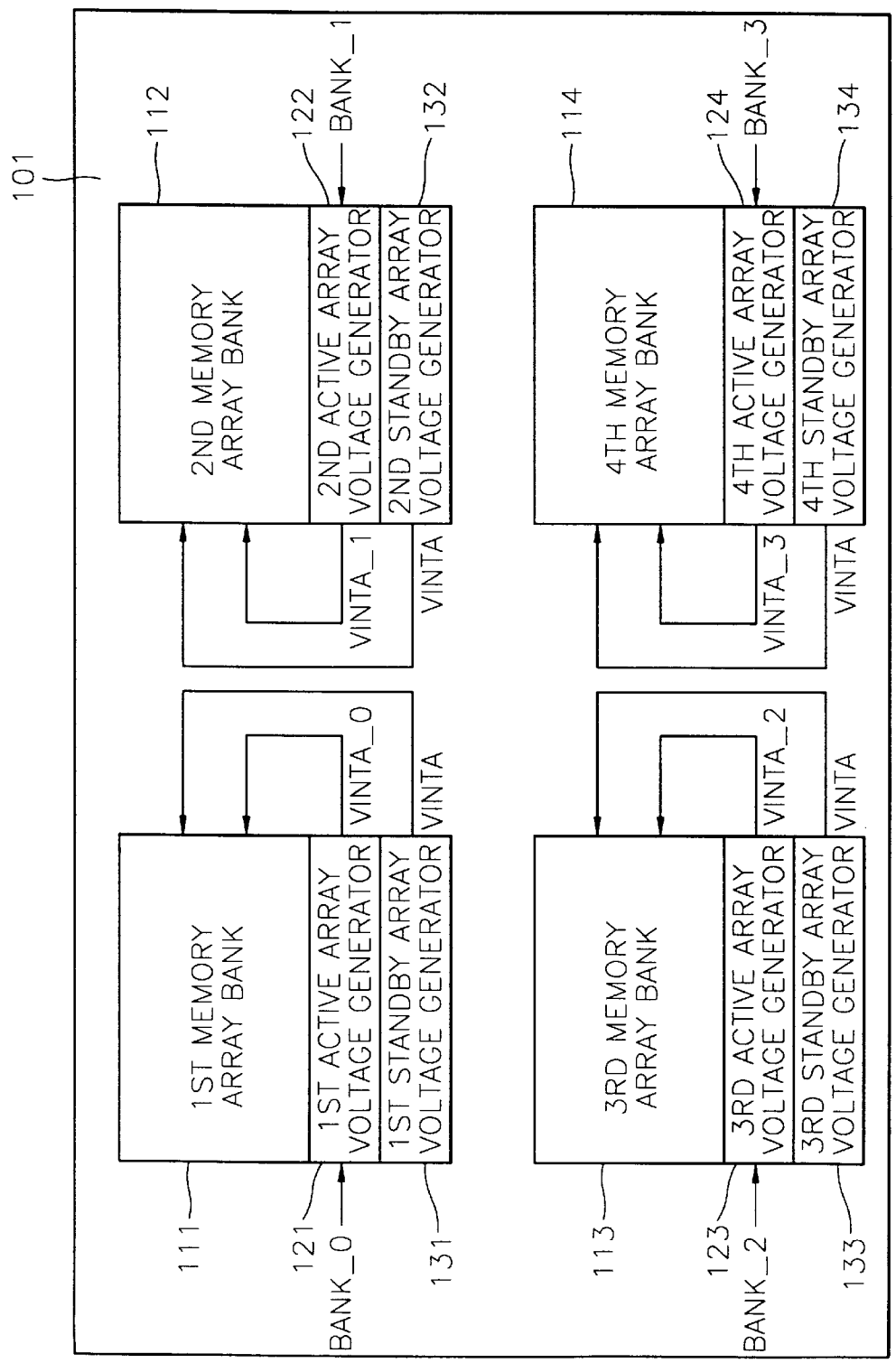
FIG. 1 is a schematic diagram illustrating a conventional semiconductor memory device having standby array voltage generators.

Since four memory array banks 211 through 214 are connected to a single standby array voltage generator 231, as shown in FIG. 2, the power consumption of the semiconductor memory device 201 is greatly reduced, compared to the conventional case when four standby array voltage generators (131 through 134 of FIG. 1) are used.

Figure 3:
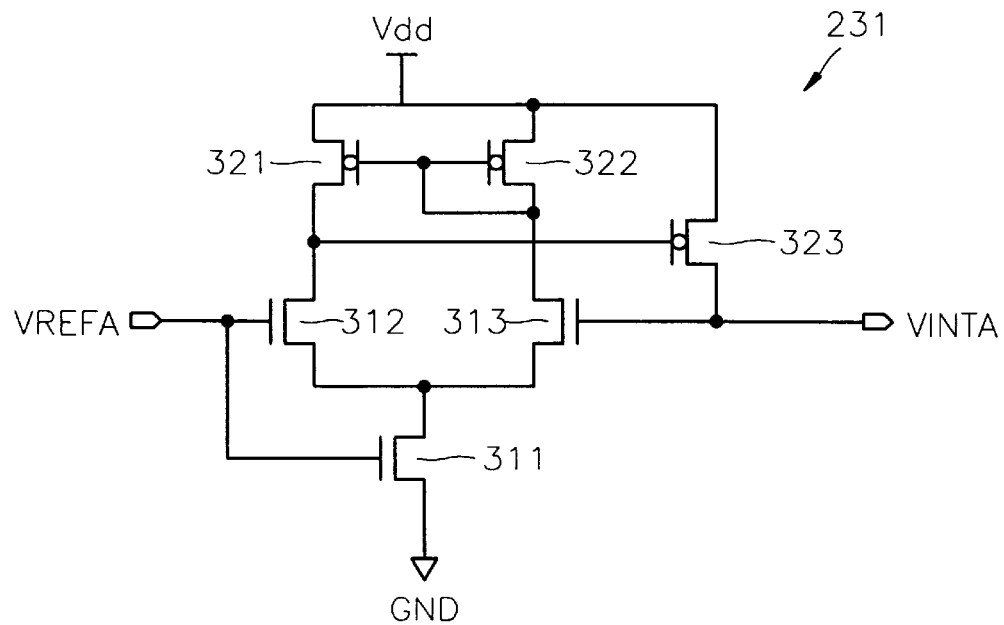
FIG. 3 is a circuit diagram illustrating standby array voltage generators shown in FIG. 2.

FIG. 3 is a circuit diagram of the standby array voltage generator 231 shown in FIG. 2. Referring to FIG. 3, the standby array voltage generator 231 includes a differential amplifier receiving a reference voltage VREFA.

The standby array voltage generator 231 includes NMOS transistors 311, 312 and 313 and PMOS transistors 321, 322 and 323. The NMOS transistor 311 serves as a current source for keeping a constant current flowing through the standby array voltage generator 231. The NMOS transistor 312 is gated by the reference voltage VREFA, and the NMOS transistor 313 is gated by an output voltage VINTA of the standby array voltage generator 231.

The PMOS transistors 321 and 322 are gated by a voltage generated at the drain of the NMOS transistor 313. In other words, if the voltage generated at the drain of the NMOS transistor 313 is at a 'H' level, the PMOS transistors 321 and 322 are turned off. If the voltage generated at the drain of the NMOS transistor 313 is at a 'L' level, the PMOS transistors 321 and 322 are turned on. The PMOS transistor 323 is gated by a voltage generated at the drain of the NMOS transistor 312. In other words, if the voltage generated at the drain of the NMOS transistor 312 is at a 'H' level, the PMOS transistor 323 is turned off. If the voltage generated at the drain of the NMOS transistor 312 is at a 'L' level, the PMOS transistor 323 is turned on. A power supply voltage Vdd is applied to the sources of the PMOS transistors 321, 322 and 323, and the source of the NMOS transistor 311 is connected to a ground terminal GND.

Now, the operation of the standby array voltage generator 231 will be described. Initially, the NMOS transistors 311 and 312 are turned off. When the reference voltage VREFA is applied to the NMOS transistors 311 and 312, and increases to higher than a threshold voltage of the NMOS transistors 311 and 312, the NMOS transistors 311 and 312 are turned on. Generally, the reference voltage VREFA is set to be higher than the threshold voltage of the NMOS transistors 311 and 312. If the NMOS transistors 311 and 312 are turned on, the voltage generated at the drain of the NMOS transistor 312 falls to a 'L' level, so that the PMOS transistor 323 is turned on. Then, the output voltage VINTA of the standby array voltage generator 231 is generated at the drain of the PMOS transistor 323. The output voltage VINTA of the standby array voltage generator 231 gradually increases, and once it becomes higher than the reference voltage VREFA, the NMOS transistor 313 is turned on to a greater extent than the NMOS transistor 312. Then, the voltage generated at the drain of the NMOS transistor 313 falls to a 'L' level. Accordingly, the PMOS transistors 321 and 322 are turned on so that the drain voltage of the NMOS transistor 312 increases from a 'L' level to a 'H' level. Thus, the PMOS transistor 323 is turned off. If the PMOS transistor 323 is turned off, the output voltage VINTA of the standby array voltage generator 231 decreases again, so that the NMOS transistor 313 is turned on to a lesser extent than the NMOS transistor 312. Then, the drain voltage of the NMOS transistor 312 decreases again. The PMOS transistor 323 is turned on to increase the output voltage VINTA of the standby array voltage generator 231. While the above-described operation is continuously performed, the output voltage VINTA of the standby array voltage generator 231 is maintained at the same level as the reference voltage VREFA so long as the reference voltage VREFA is continuously applied.

Figure 4:
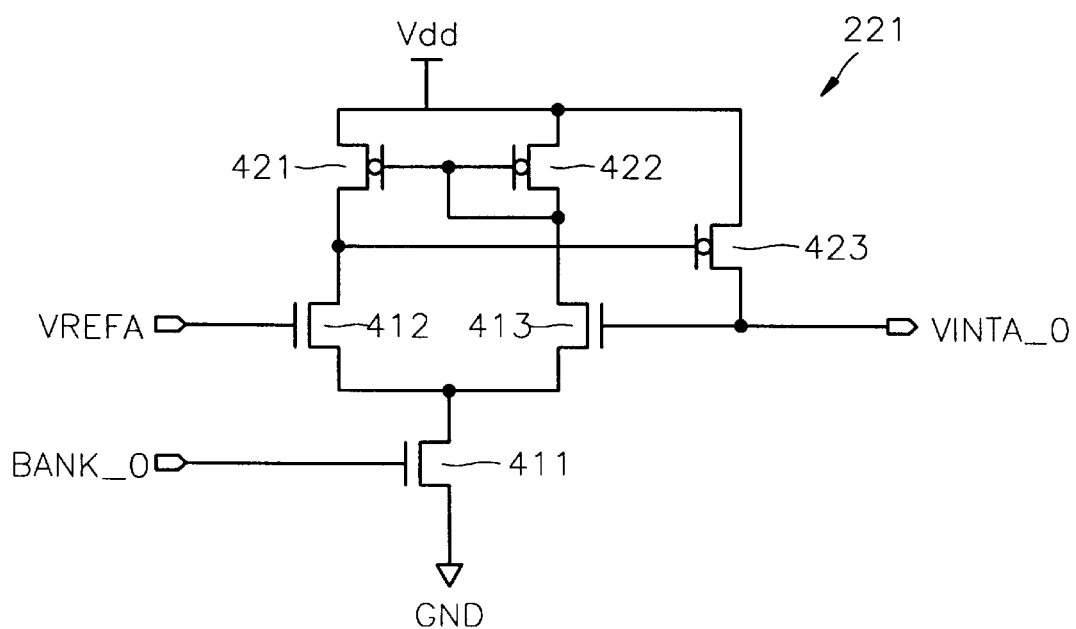
FIG. 4 is a circuit diagram illustrating a first active array voltage generator shown in FIG. 2.

FIG. 4 is a circuit diagram of the first active array voltage generator 221 shown in FIG. 2. Referring to FIG. 4, the first active array voltage generator 221 includes a differential amplifier receiving the reference voltage VREFA and the first memory array bank enable signal BANK_0.

The first active array voltage generator 221 includes NMOS transistors 411, 412 and 413, and PMOS transistors 421, 422 and 423.

The NMOS transistor 411 is gated by the first memory array bank enable signal BANK_0. In other words, if the first memory array bank enable signal BANK_0 is activated to a 'H' level, the NMOS transistor 411 is turned on so that a constant current flows through the first active array voltage generator 221. If the first memory array bank enable signal BANK_0 is inactivated to a 'L' level, the NMOS transistor 411 is turned off so that the first active array voltage generator 221 does not operate.

The NMOS transistor 412 is gated by the reference voltage VREFA, and the NMOS transistor 413 is gated by an output voltage VINTA_0 of the first active array voltage generator 221.

The PMOS transistors 421 and 422 are gated by a voltage generated at the drain of the NMOS transistor 413. In other words, if the voltage generated at the drain of the NMOS transistor 413 is at a 'H' level, the PMOS transistors 421 and 422 are turned off. If the voltage generated at the drain of the NMOS transistor 413 is at a 'L' level, the PMOS transistors 421 and 422 are turned on. The PMOS transistor 423 is gated by a voltage generated at the drain of the NMOS transistor 412. In other words, if the voltage generated at the drain of the NMOS transistor 412 is at a 'H' level, the PMOS transistor 423 is turned off. If the voltage generated at the drain of the NMOS transistor 412 is at a 'L' level, the PMOS transistor 423 is turned on. A power supply voltage Vdd is applied to the sources of the PMOS transistors 421, 422 and 423, and the source of the NMOS transistor 411 is connected to a ground terminal GND.

The operation of the first active array voltage generator 221 will be described. When it is not necessary to activate the first memory array bank (211 of FIG. 2), the first memory array bank enable signal BANK_0 is at a 'L' level, that is, in an inactive state. If the first memory array bank enable signal BANK_0 is inactive, the first active array voltage generator 221 does not operate. Thus, the output voltage VINTA_0 of the first active array voltage generator 221 is at a 'L' level.

The reference voltage VREFA is always available irrespective of the logic state of the first memory array bank enable signal BANK_0. If the reference voltage VREFA is applied to the first active array voltage generator 221 and the first memory array bank enable signal BANK_0 is inactive, the first active array voltage generator 221 does not operate. Then, when the first memory array bank enable signal BANK_0 is activated and increases to higher than a threshold voltage of the NMOS transistor 411, the NMOS transistor 411 is turned on. Generally, the reference voltage VREFA is set to be higher than the threshold voltage of the NMOS transistors 411 and 412. Thus, if the NMOS transistor 411 is turned on, the NMOS transistor 412 is also turned on, so that the voltage generated at the drain of the NMOS transistor 412 falls to a 'L' level. Thus, the PMOS transistor 423 is turned on, and the output voltage VINTA_0 of the first active array voltage generator 221 is generated at the drain of the PMOS transistor 423. The output voltage VINTA 0 of the first active array voltage generator 221 gradually increases, and once it becomes higher than the reference voltage VREFA, the NMOS transistor 413 is turned on to a greater extent than the NMOS transistor 412. Then, the voltage generated at the drain of the NMOS transistor 413 falls to a 'L' level. Accordingly, the PMOS transistors 421 and 422 are turned on so that the drain voltage of the NMOS transistor 412 increases from a 'L' level to a 'H' level. Thus, the PMOS transistor 423 is turned off. If the PMOS transistor 423 is turned off, the output voltage VINTA_0 of the first active array voltage generator 221 decreases again, so that the NMOS transistor 413 is turned on to a lesser extent than the NMOS transistor 412. Then, the drain voltage of the NMOS transistor 412 decreases again. The PMOS transistor 423 is turned on to increase the output voltage VINTA_0 of the first active array voltage generator 221. While the above-described operation is continuously performed, the output voltage VINTA_0 of the first active array voltage generator 221 is maintained at the same level as the reference voltage VREFA so long as the first memory bank array enable signal BANK_0 is active.

The configuration and operation of the second through fourth active array voltage generators 222 through 224 shown in FIG. 2 are the same as those of the first active array voltage generator 221 shown in FIG. 3.

Figure 5:
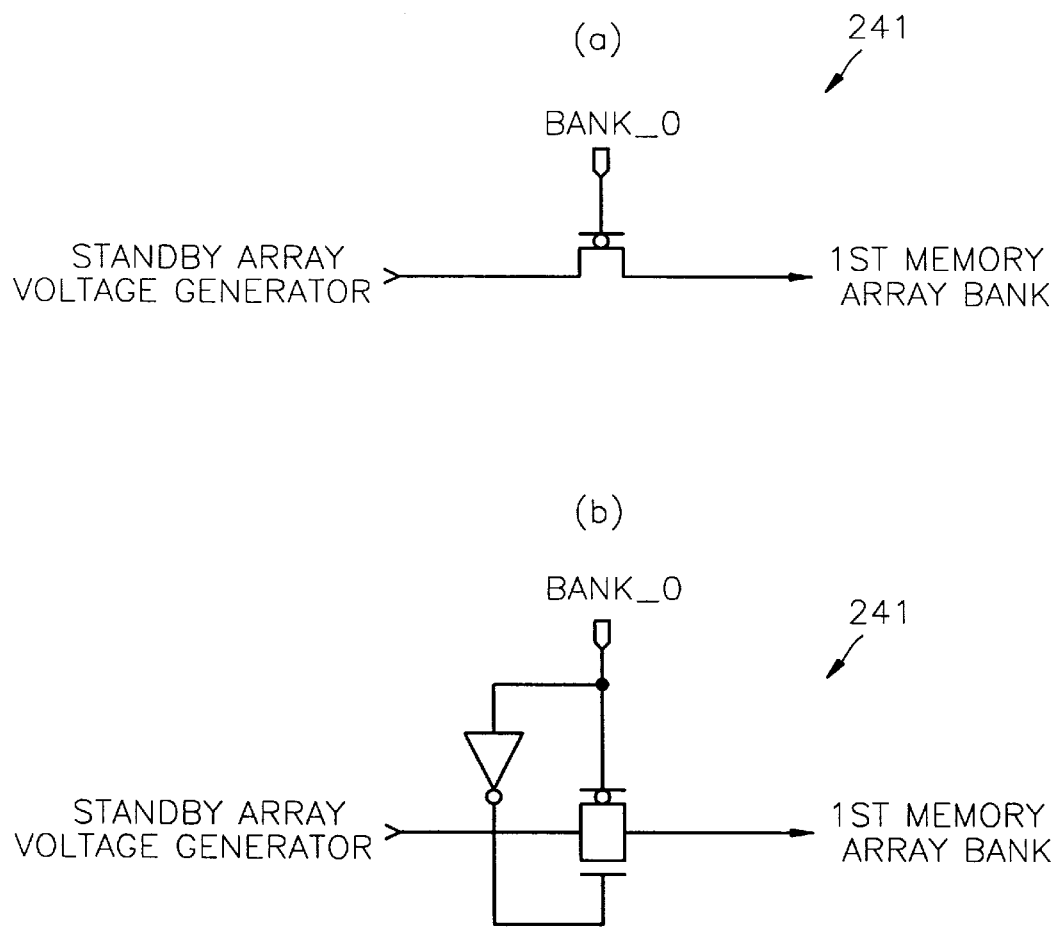
FIGS. 5A and 5B are circuit diagrams respectively illustrating first and second examples of a first switching means shown in FIG. 2.

FIGS. 5A and 5B are circuit diagrams illustrating first and second examples of the first switching means 241 shown in FIG. 2, respectively. Referring to FIG. 5A, the first switching means 241 includes a PMOS transistor having a source connected to the standby array voltage generator (231 of FIG. 2) and a drain connected to the first memory array bank (211 of FIG. 2), and which is gated by the first memory array bank enable signal BANK_0. Thus, when the first memory array bank enable signal BANK_0 is inactivated to a 'L' level, the first switching means 241 is turned on to transmit the output voltage VINTA of the standby array voltage generator (231 of FIG. 2) to the first memory array bank (211 of FIG. 2). When the first memory array bank enable signal BANK_0 is activated to a 'H' level, the first switching means 241 is turned off to disconnect the output voltage VINTA of the standby array voltage generator (231 of FIG. 2) from the first memory array bank (211 of FIG. 2).

Referring to FIG. 5B, the first switching means 241 includes a transmission gate having an input terminal connected to the standby array voltage generator (231 of FIG. 2) and an output terminal connected to the first memory array bank (211 of FIG. 2), and which is gated by the first memory array bank enable signal BANK_0. Thus, when the first memory array bank enable signal BANK 0 is inactivated to a 'L' level, the first switching means 241 is turned on to transmit the output voltage VINTA of the standby array voltage generator (231 of FIG. 2) to the first memory array bank (211 of FIG. 2). When the first memory array bank enable signal BANK 0 is activated to a 'H' level, the first switching means 241 is turned off to disconnect the output voltage VINTA of the standby array voltage generator (231 of FIG. 2) from the first memory array bank (211 of FIG. 2).

As described above, if the first memory array bank (211 of FIG. 2) is active, the output voltage VINTA_0 of the first active array voltage generator (221 of FIG. 2) is transmitted to the first memory array bank (211 of FIG. 2), and the output voltage of the standby array voltage generator (231 of FIG. 2) is not transmitted to the first memory array bank (211 of FIG. 2). However, if the first memory array bank (211 of FIG. 2) is inactive, that is, is in a standby state, the output voltage VINTA_0 of the first active array voltage generator (221 of FIG. 2) is not transmitted to the first memory array bank (211 of FIG. 2), and the output voltage of the standby array voltage generator (231 of FIG. 2) is transmitted to the first memory array bank (211 of FIG. 2).

The present invention is not limited to the above-described embodiment. It is clearly understood that various modifications and changes may be effected within the spirit of the present invention by one skilled in the art.

As described above, according to the present invention, since four memory array banks (211 through 214 of FIG. 2) are connected to a single standby array voltage generator (231 of FIG. 2), the power consumption of the semiconductor memory device (201 of FIG. 2) is much less than the conventional case when four standby array voltage generators (131 through 134 of FIG. 1) are used.

What is claimed is:

1. A multi-bank memory device, comprising:
a first active array voltage generator that is responsive to a reference voltage signal and generates a first active array voltage at a first voltage level on a first active power supply signal line when a first memory array bank signal applied thereto is in a first logic state, said first voltage level having a magnitude that equals a magnitude of the reference voltage signal;

a standby voltage generator that is responsive to the reference voltage signal and generates a standby voltage at the first voltage level on a standby power supply signal line that is electrically connected to an output of said standby voltage generator;

a first memory array bank electrically coupled to the first active power supply signal line; and a first switch that is responsive to the first memory array bank signal and closes to electrically connect the standby power supply signal line to said first memory array bank when the first memory array bank signal is in a second logic state opposite the first logic state, but does not have circuitry therein that can be used to disconnect an output of said first active array voltage generator from the first active power supply signal line.

2. The memory device of claim 1, wherein said first active array voltage generator disposes the first active power supply signal line in a high impedance state when the first memory array bank signal is in the second logic state.

3. The memory device of claim 1, wherein said first active array voltage generator comprises a first differential amplifier having a first input that receives the reference voltage signal and a second input that is electrically connected to the first active power supply signal line.

4. The memory device of claim 3, wherein said standby voltage generator comprises a second differential amplifier having a first input that receives the reference voltage signal and a second input that is electrically connected to the standby power supply signal line.

5. The memory device of claim 4, wherein said first active array voltage generator comprises a first NMOS transistor as a current source; and wherein the first NMOS transistor has a gate electrode that receives the first memory array bank signal.

6. The memory device of claim 5, wherein said standby voltage generator comprises a second NMOS transistor as a current source; and wherein the second NMOS transistor has a gate electrode that receives the reference voltage signal.

7. The memory device of claim 6, wherein said first active array voltage generator comprises a first PMOS pull-up transistor having a gate electrode that receives a first output of the first differential amplifier; and wherein said standby voltage generator comprises a second PMOS pull-up transistor having a gate electrode that receives a first output of the second differential amplifier.

8. A multi-bank memory device, comprising:

a first active array voltage generator that is responsive to a reference voltage signal and generates a first active array voltage at a first voltage level on a first active power supply signal line when a first memory array bank signal applied thereto is in a first logic state;

a standby voltage generator that is responsive to the reference voltage signal and generates a standby voltage at the first voltage level on a standby power supply signal line that is electrically connected to an output of said standby voltage generator;

a first memory array bank electrically coupled to the first active power supply signal line;

a first switch that is responsive to the first memory array bank signal and closes to electrically connect the standby power supply signal line to said first memory array bank when the first memory array bank signal is in a second logic state opposite the first logic state;

a second active array voltage generator that generates a second active array voltage at the first voltage level on a second active power supply signal line when a second memory array bank signal applied thereto is in the first logic state;

a second memory array bank electrically coupled to the second active power supply signal line; and a second switch that is responsive to the second memory array bank signal and closes to electrically connect the standby power supply signal line to said second memory array bank when the second memory array bank signal is in a second logic state opposite the first logic state.

9. The memory device of claim 8, wherein said first switch and said second switch each comprise a CMOS transmission gate.

10. The memory device of claim 9, wherein a magnitude of the reference voltage signal equals a magnitude of the first voltage level; and wherein said second switch does not have circuitry therein that can be used to disconnect an output of said second active array voltage generator from the second active power supply signal line.

11. The memory device of claim 10, wherein said first active array voltage generator comprises a first differential amplifier having a first input that receives the reference voltage signal and a second input that is electrically connected to the first active power supply signal line.

12. The memory device of claim 11, wherein said standby voltage generator comprises a second differential amplifier having a first input that receives the reference voltage signal and a second input that is electrically connected to the standby power supply signal line.

13. The memory device of claim 12, wherein said first active array voltage generator comprises a first NMOS transistor as a current source; and wherein the first NMOS transistor has a gate electrode that receives the first memory array bank signal.

14. The memory device of claim 13, wherein said standby voltage generator comprises a second NMOS transistor as a current source; and wherein the second NMOS transistor has a gate electrode that receives the reference voltage.

15. The memory device of claim 14, wherein said first active array voltage generator comprises a first PMOS pull-up transistor having a gate electrode that receives a first output of the first differential amplifier; and wherein said standby voltage generator comprises a second PMOS pull-up transistor having a gate electrode that receives a first output of the second differential amplifier.

* * * * *